(12) United States Patent
Coleman (10) Patent No.: US 7,449,640 B2
(45) Date of Patent: Nov. 11, 2008

(54) ALIGNMENT FEATURES FOR DICING MULTI ELEMENT ACOUSTIC ARRAYS

(75) Inventor: Allan Coleman, Edmonds, WA (US)

(73) Assignee: Sonosite, Inc., Bothell, WA (US)

( * ) Notice: Subject to any disclaimer, the term of this patent is extended or adjusted under 35 U.S.C. 154(b) by 344 days.

(21) Appl. No.: 11/251,568

(22) Filed: Oct. 14, 2005

(65) Prior Publication Data

US 2007/0085452 A1    Apr. 19, 2007

(51) Int. Cl.
*H01B 7/08* (2006.01)
(52) U.S. Cl. .................................. 174/117 FF
(58) Field of Classification Search .............. 174/117 F, 174/117 FF; 310/334, 335
See application file for complete search history.

(56) References Cited

U.S. PATENT DOCUMENTS

| 3,708,610 | A | * | 1/1973 | Kolzel et al. ............... 174/72 B |
| 5,115,810 | A | * | 5/1992 | Watanabe et al. ........... 600/459 |
| 6,104,126 | A | | 8/2000 | Gilmore |
| 2003/0174483 | A1 | | 9/2003 | Yuzawa |

OTHER PUBLICATIONS

Partial International Search Report issued for PCT/US2006/039449 dated Feb. 7, 2007.

* cited by examiner

*Primary Examiner*—Chau N Nguyen
(74) *Attorney, Agent, or Firm*—Fulbright & Jaworski L.L.P.

(57) ABSTRACT

A method and system include a cable including a plurality of conductors terminating at a leading edge of the cable, and markers disposed at the leading edge providing visual reference points at one or more predetermined positions, the markers being separate from the plurality of conductors.

33 Claims, 5 Drawing Sheets

701 — PROVIDING A CABLE THAT INCLUDES:

(A) A RIBBON INCLUDING A PLURALITY OF CONDUCTORS TERMINATING AT A LEADING EDGE OF THE CABLE AND A LAYER OF AN INSULATING MATERIAL THEREON; AND (B) A SUPPORTING BLOCK SURROUNDING THE RIBBON AND EXPOSING THE LEADING EDGE AT A SURFACE OF THE SUPPORTING BLOCK, WHEREIN THE LEADING EDGE INCLUDES A STRUCTURE THAT EXTENDS BEYOND THE SURFACE, THE STRUCTURE INCLUDING VISUAL MARKINGS THAT INDICATE POSITIONS OF THE PLURALITY OF SIGNAL TRACES

702 — POSITIONING AN ELECTRONIC COMPONENT ON THE SURFACE OF THE SUPPORTING BLOCK SO THAT THE STRUCTURE IS FOLDED AND THE MARKINGS EXTEND BEYOND THE EDGES OF THE ELECTRONIC COMPONENT

703 — BASED UPON THE MARKINGS, DICING THE ELECTRONIC COMPONENT TO PRODUCE A PLURALITY OF SEPARATE TRANSDUCER ELEMENTS, EACH ELEMENT CONNECTED TO AT LEAST ONE CONDUCTOR OF THE PLURALITY OF CONDUCTORS

704 — REMOVING A PORTION OF THE STRUCTURE THAT EXTENDS BEYOND THE EDGES OF THE ELECTRONIC COMPONENT

ALIGNMENT FEATURES FOR DICING MULTI ELEMENT ACOUSTIC ARRAYS

TECHNICAL FIELD

The invention relates in general to manufacturing electronic components and specifically relates to the manufacture of transducer arrays for a variety of systems.

BACKGROUND OF THE INVENTION

Figure 1:
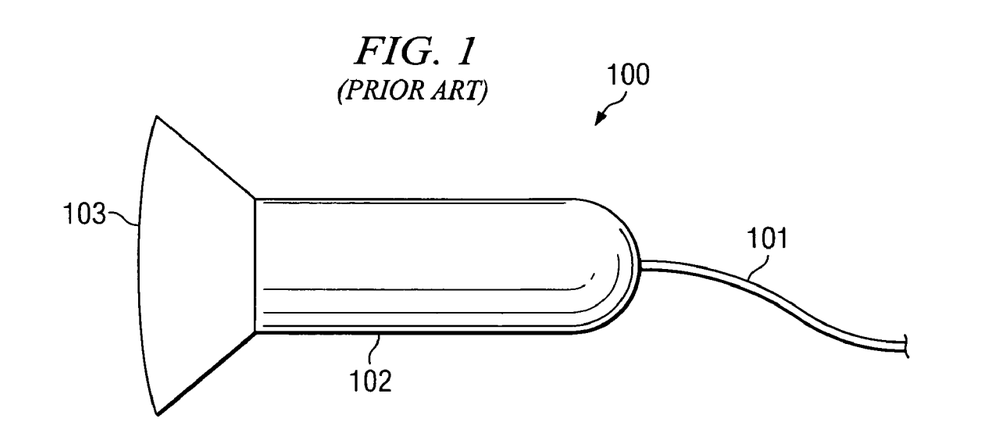
FIG. 1 is an illustration of an example ultrasound transducer.

FIG. 1 is an illustration of example ultrasound transducer 100. Transducer 100 includes, among other things, cable 101 that carries signals between transducer 100 and a processing and control unit (not shown). Transducer 100 also includes body 102 for providing a handle shape for an ultrasound operator to grip transducer 100 when performing an ultrasound examination. Surface 103 of transducer 100 contacts a patient or other subject and includes a plurality of individual transducer elements that transmit and receive acoustic waves during an examination. The processing and control unit controls the beam forming in transducer 100 and also processes the electrical signals produced by the transducer elements as the elements receive reflected acoustic waves during an examination.

Figure 2:
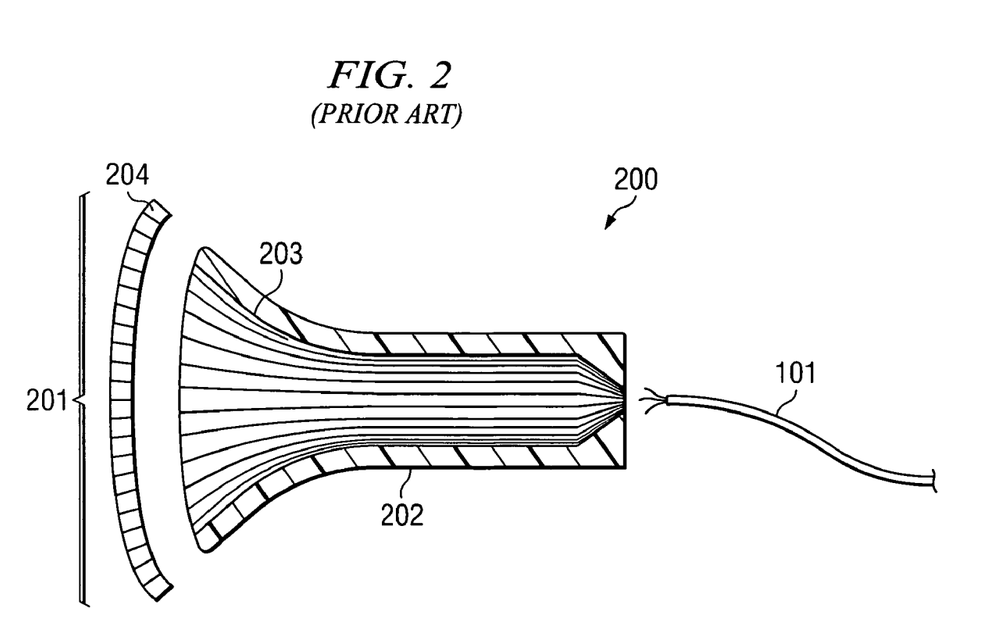
FIG. 2 is an exploded view of example components inside an example transducer.

FIG. 2 is an exploded view of example components 200 inside transducer 100. As shown, cable 101 is connected to flex circuit 202, and flex circuit 202 is connected to transducer array 201 such that the control and processing unit (not shown) is in electrical communication with transducer array 201. Transducer array 201 includes individual acoustic transducer elements 204, which, in this example, are individually controlled active acoustic elements that produce acoustic waves from electrical stimulation and produce electrical signals in response to receiving reflected acoustic waves. Transducer array 201 is usually fabricated as an "acoustic stack"—one or more ceramic or polymer layers that are metallized on both sides. As explained more fully below, the acoustic stack is cut into a plurality of individual transducer elements. The ceramic or polymer itself is not electrically conductive, but is a piezoelectric material that may be excited by applying a high voltage across its two outer surfaces. The control and processing unit detects minute voltage fluctuations in the signal received from array 201 and performs digital signal processing to produce an image for a human user.

Flex circuit 202 is an intermediary device to connect relatively rigid cable assembly 101 to fragile, small, and minute acoustic elements 204. Flex circuit 202, in this example, is a flexible printed circuit that includes a plurality of signal traces 203 and is similar in some respects to a ribbon. In some examples, flex circuit 202 includes signal traces on a layer of KAPTON™, which is a non-conducting, flexible polymer available from E.I. du Pont de Nemours and Company, that provides flexible support to the traces.

The current art provides for several ways to create an electrical connection between the system electronic circuits in the control and processing unit and the plurality of acoustic elements. Specifically, the prior art provides methods of electrically attaching cable assemblies from the control and processing unit to the acoustic stack itself. One example process includes embedding flex circuit 202 in a block of backing material (not shown), which helps to support both the acoustic stack and the flex circuit 202 during manufacturing and use and also helps to dampen acoustic vibrations in the assembly. A leading edge of flex circuit 202 is visible and exposed at a surface of the backing material so that an electrical connection can be made between flex circuit 202 and the acoustic stack by placing the acoustic stack on the surface so that it contacts flex circuit 202. No soldering is used. The dicing saw operator then cuts through the acoustic stack and the backing material between each of signal traces 203 to create electrically isolated acoustic elements 204. An example method for attaching a backing block and conductive elements to an acoustic stack without soldering is described in U.S. Pat. No. 6,104,126, issued Aug. 15, 2000, the disclosure of which is hereby incorporated herein by reference.

In contrast, current industry standards include soldering flex circuit 202 to the exposed metallized face or edges of the acoustic stack before dicing. A difficulty with both methods is that the exposed leading edge of flex circuit 202 is underneath the acoustic stack, thereby obscuring the signal traces and making the dicing operation more challenging.

Figure 3:
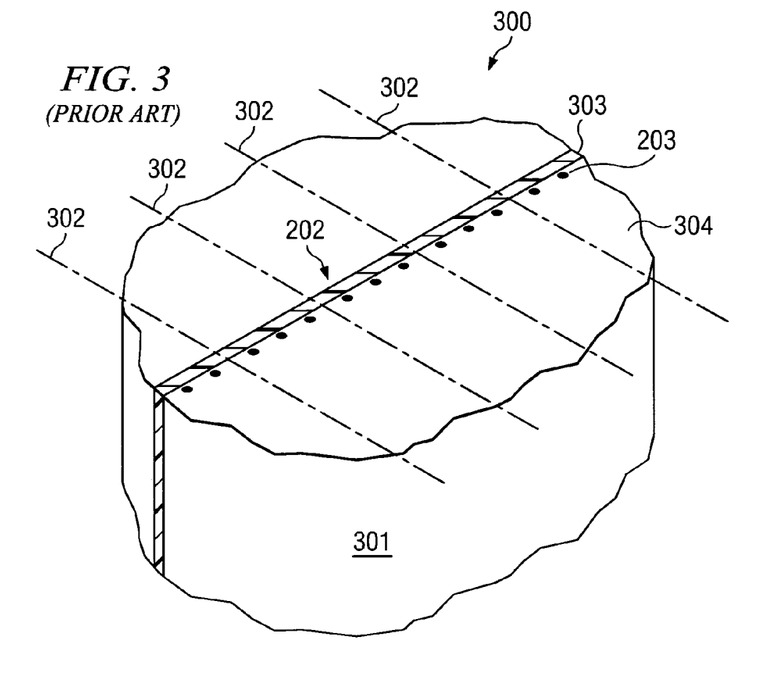
FIG. 3 is an illustration of an example flex circuit assembly.

FIG. 3 is an illustration of example flex circuit assembly 300. Flex circuit 202 (FIG. 2) includes KAPTON™ layer 303 and a plurality of signal traces 203. Assembly 300 includes backing block 301, which is made of a more rigid, nonconductive material (e.g. acoustic backing material) that surrounds flex circuit 202. Assembly 300 includes surface 304 where a leading edge of flex circuit 202 is visible. In order to guide the dicing saw operator, the assembly line (or the saw operator) scribes backing block 301 with marks 302 (i.e., kerfs) to the edges of block 301. Marks 302 are produced by making shallow cuts in block 301 between the signal traces, thereby transferring a datum feature to the outside of block 301. Marks 302 may then be seen by the saw operator after the acoustic stack is laid down on block 301. Marks 302 indicate spaces between the signal traces where cuts should be made. Marks 302 may be made for each signal trace or may be spaced apart by multiple signal traces in a pattern. In the example of FIG. 3, marks 302 are spaced at every third signal trace.

In both examples above, the dicing cuts and the kerfs are based on the positions of the actual signal traces in the leading edge of flex circuit 202. However, in some applications, discrete signal traces at the leading edges may not be available, making the above-described methods unusable.

BRIEF SUMMARY OF THE INVENTION

Various embodiments of the present invention are directed to systems and methods which include alignment markers in the flex circuit that are separate from the signal-carrying conductors. From the markers, scoring marks can be made on the backing block to guide a dicing saw. Alternatively, a dicing saw operator can guide the saw based on the markers, themselves. Example manufacturing techniques connect the signal traces in a buss at the leading edge of the flex circuit, thereby visually obscuring the individual signal traces at the leading edge. Accordingly, various embodiments of the invention may add utility to such techniques by providing alignment markers that are different and/or electrically isolated from the buss and the signal traces.

In one example embodiment, the flex circuit is made of a number of layers with the alignment markers on a layer different than the layer that includes the signal carrying traces. For instance, the markers may be included on a layer that is used for a ground plane and insulated from the signal carrying conductors by a flexible insulating layer. The markers indicate the positions of the signal traces and are exposed and/or visible at the leading edge of the flex cable. The alignment markers may be used to make kerfs or dices. In another example embodiment, the flex circuit includes a strip of material that protrudes out from the backing block and includes alignment markers. When the acoustic stack is placed on the backing block, the strip is folded down, and portions of the strip extend past the edge of the stack, thereby providing a visual indicator for the dicing saw operator to make cuts.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 4:
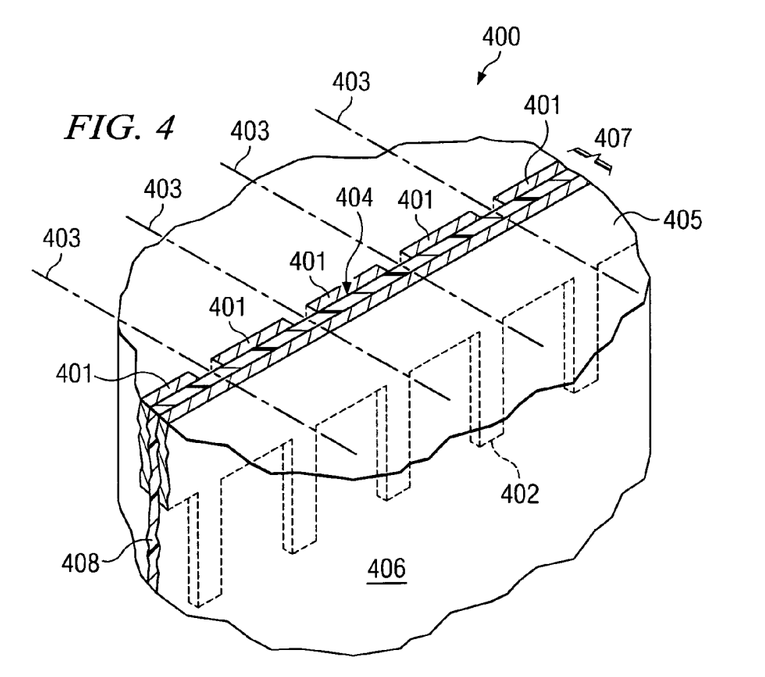
FIG. 4 is an illustration of an example flex circuit assembly according to one embodiment of the invention.

FIG. 4 is an illustration of example flex circuit assembly 400 according to one embodiment of the invention. Assembly 400 includes backing block 406, and embedded signal traces 402 are present inside backing block 406 but cannot be seen by a human operator. Flex circuit 407 includes buss 404, which terminates and shorts signal traces 402 at the leading edge thereof, so that a human operator sees a line of copper or other conducting material when viewing surface 405. When the operator dices the acoustic stack (not shown), the cuts extend past the depth of buss 404, thereby creating individual contacts out of a once continuous strip of conducting material. Buss 404, once it is diced, provides wide contacts between the transducer elements and their respective signal traces 402. An advantage of using buss 404 rather than individual signal traces at the leading edge of flex circuit 407 is that the buss provides wider contacts, and the reliability and signal conducting quality of a contact usually increases with its width.

The flex circuit also includes flexible insulating layer 408, possibly made of KAPTON™, that provides some support to traces 402. Despite its name, however, flex circuit 407 is not required to be flexible, as insulating layer 408 may be constructed of fiberglass or other more relatively rigid material.

When dicing or scribing marking lines on surface 405, an operator cannot rely on visual inspection of traces 402 to determine their positions because signal traces 402 are not visible at the leading edge. Therefore, the prior art methods described above provide little utility in this example. Accordingly, flex circuit 407 includes markers 401 that indicate positions of signal traces 402. Alignment markers 401 may be aligned with signal traces 402 or may be aligned with spaces between signal traces 402, in which case, markers 401 would implicitly (rather than explicitly) indicate the positions of traces 402. The invention is not limited to any particular method of alignment as long as a person or machine may determine or infer placement of traces 402 from markers 401.

Markers 401 may be produced, for example, by laying down an additional layer of conducting material on flex circuit 407. Typical flex circuits include several alternating layers of insulating material (e.g., KAPTON™) and conducting material (e.g., copper). The conducting material carries the electrical signals and the insulating material isolates the signal-carrying traces from each other. Alignment marks 401 can be an additional layer of copper bonded to the surface of insulating layer 408, or can be part of an existing layer of material in flex circuit 407. For example, alignment marks 401 can be applied to flex circuit 407 along with a copper ground plane, assuming that marks 401 are electrically isolated from the rest of the copper in the plane. For instance, the ground plane may stop short of the alignment markers and the end of the flex circuit to avoid shorting the transducers. Such a feature may provide for less expensive manufacturing of assembly 400, since the alignment markers may be printed with the ground plane. Signal traces 402, in this example, are of a pitch equal to that of alignment markers 401; however, the pitch of markers 401 may be a multiple or other ratio of the pitch of traces 402.

A possible way to dice the acoustic stack and create individual transducer elements is to fabricate buss 404 to a very precise length, and then index a computerized saw blade from one end of buss 404. The program controlling the saw then makes precise cuts at predetermined distances from the end. However, a disadvantage is that some amount of inaccuracy is typically present, especially when using only one end of buss 404 as an index.

A second possible way to dice the acoustic stack is to create kerfs 403 on surface 405 to guide the saw operator. Since alignment markers 401 are visible on surface 405 and are precisely placed to indicate the positions of traces 402, a human or machine can make kerfs 403 aligned with markers 401 to indicate placement of dicing cuts. The acoustic stack may then be placed on surface 405 and diced according to kerfs 403. In this way, a saw operator is ensured that such cuts will be placed between traces 402, thereby creating a plurality of individual transducer elements.

In one example, kerfs 403 are only about two thousandths of an inch deep so that they make a mark in block 406 but do not sever buss 404. During the final dice, the operator cuts through the acoustic stack and into backing block 406, which, in this example, is enough to sever buss 404, which is typically a few thousandths of an inch in depth.

Figure 5:
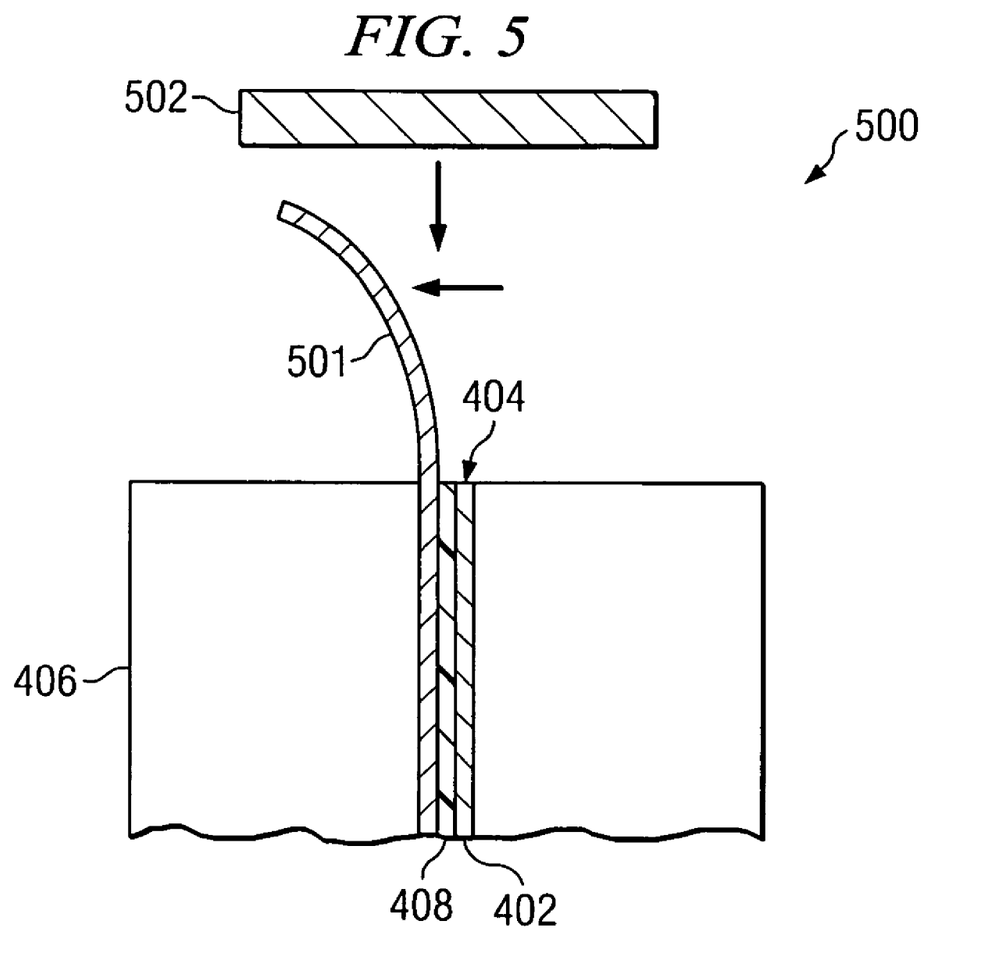
FIG. 5 is an illustration of an example flex circuit assembly according to one embodiment of the invention.

FIG. 5 is an illustration of example flex circuit assembly 500 according to one embodiment of the invention. FIG. 5 is a side view of assembly 500, positioned such that buss 404 and signal traces 402 appear to the eye as a single, vertical component. Assembly 500 includes backing block 406, buss 404, traces 402, and non-conducting layer 408. In this example, the alignment markers are included on flap 501. For instance, flap 501 includes alignment markers as vertical lines (not shown) that indicate the placement of signal traces 402. Flap 501 protrudes from block 406 and can be bent outward and away from acoustic stack 502 during placement of acoustic stack 502. This provides the dicing saw operator with one or more marks that are beyond the periphery of acoustic stack 502 and, therefore, visible at the time of dicing. The saw operator can then dice acoustic stack 502 according to the markers. It is possible that flap 501 may be trimmed off and removed after dicing, and may not be used for other processes in the assembly of the transducer.

Flap 501 may be made of a nonconductive material, such as KAPTON™, or may be made of copper or other materials as long as it does not interfere with the signal connections of the transducer array. In fact, flap 501 may be part of an existing KAPTON™ layer that is extended beyond block 406. Alternatively, flap 501 may include thin pieces of copper extending beyond the KAPTON™, whereby the pieces of copper, themselves, act as the alignment markers. An advantage of some embodiments that use flaps is that the flaps take the place of scoring, thereby eliminating the step of making kerfs.

Figure 6:
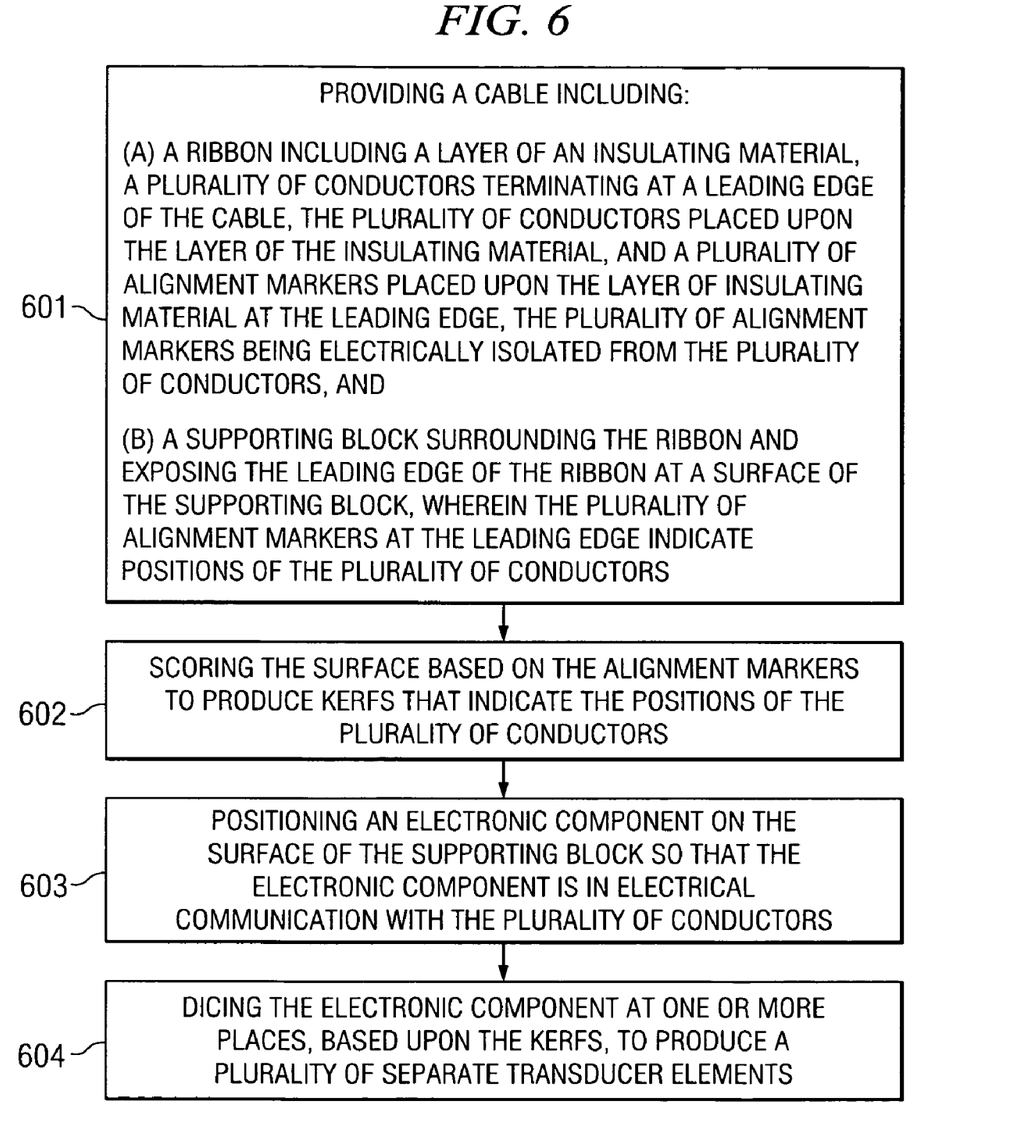
FIG. 6 is a flowchart of an example method for manufacturing a transducer device with the flex circuit assembly of FIG. 4.

FIG. 6 is a flowchart of example method 600 for manufacturing a transducer device with flex circuit assembly 400 (FIG. 4). In step 601, a person or machine provides a cable with a flex circuit and a supporting block. The flex circuit includes a plurality of conductors terminating at a leading edge of the cable, and the plurality of conductors are placed upon a layer of insulating material, and a plurality of alignment markers are also placed upon the layer of insulating material at the leading edge. The plurality of alignment markers are electrically isolated from the plurality of conductors, and are, therefore, separate from the conductors.

The cable also includes a supporting block surrounding the flex circuit and exposing the leading edge of the flex circuit at a surface of the supporting block. Further, the plurality of alignment markers at the leading edge indicate positions of the plurality of conductors. Flex circuit assembly 401 of FIG. 4 is suitable for use as the cable in step 601. In such an embodiment, the plurality of conductors includes signal traces connected by a buss at the leading edge of the cable.

In step 602, a person or machine scores the surface of the supporting block based on the alignment markers to produce kerfs that indicate the positions of the plurality of conductors. In one example, the kerfs are aligned with edges of the markers. In another example, the kerfs are aligned with the midpoints of the markers. The invention is not limited to any particular way of aligning kerfs with alignment markers, and any given way is within the scope of one or more embodiments. The kerfs extend toward the edge of the block sufficient to be visible after the acoustic stack is placed on the block.

In step 603, a person or machine positions an electronic component on the surface of the supporting block so that the electronic component is in electrical communication with the plurality of conductors. In an example embodiment, an acoustic stack is placed on the surface so that it contacts the buss that connects the signal traces. In an embodiment that terminates signal traces without a buss, step 603 includes positioning the electronic device so that electrical connection is made with an adequate number of individual traces.

In step 604, a person or machine dices the electronic component at one or more places, based upon the kerfs, to produce a plurality of separate transducer elements. In an embodiment wherein the kerfs are aligned with spaces between the conductors, dicing cuts may be made directly on the kerfs. In embodiments wherein the kerfs are aligned with the conductors, dicing cuts may be made between the kerfs, for example, at particular offsets from each kerf. When the flex circuit connects signal traces with a buss at the leading edge, step 604 may further include cutting through the buss to make electrically separate transducer elements.

Figure 7:
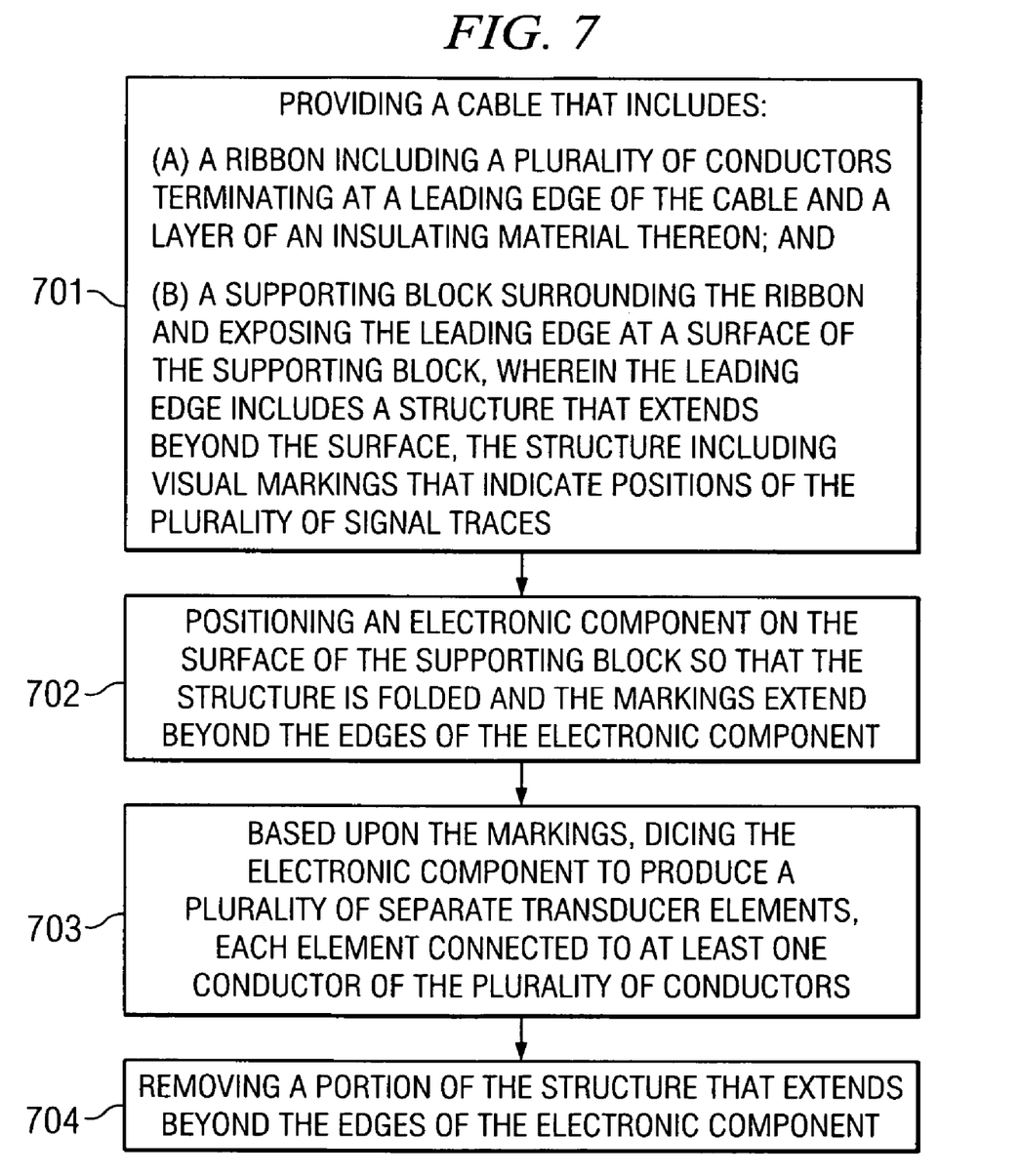
FIG. 7 is a flowchart of an example method for manufacturing a transducer device with the flex circuit assembly of FIG. 5.

FIG. 7 is a flowchart of example method 700 for manufacturing a transducer device with flex circuit assembly 500 (FIG. 5). In step 701, a person or machine provides a cable that includes a flex circuit. The flex circuit has a plurality of conductors terminating at a leading edge of the cable, and the plurality of conductors are placed on a layer of an insulating material.

The cable also includes a supporting block surrounding the flex circuit and exposing the leading edge at a surface of the supporting block. Further, the leading edge includes a structure that extends beyond the surface of the supporting block and has visual markings that indicate positions of the plurality of signal traces. Flex circuit assembly 500 (FIG. 5) may be used as the cable of step 601.

In step 702, a person or machine positions an electronic component on the surface of the supporting block so that the structure is folded and the markings extend beyond the edges of the electronic component. In an example, an acoustic stack is placed on the supporting block, and the structure is a flap of KAPTON™ with alignment marks that is folded over.

In step 703, based upon the markings, a person or machine dices the electronic component to produce a plurality of separate transducer elements, and each element is connected to at least one conductor of the plurality of conductors. In an example, a dicing saw operator aligns the saw with the markings on the part of the structure that extends beyond the acoustic stack. Then, the operator dices the stack as many times as necessary to produce a desired number of elements.

In step 704, a person or machine removes a portion of the structure that extends beyond the edges of the electronic component. In an example embodiment, the flap of material with markings is not used for other purposes, and is removed by trimming in preparation for creation of a consumer or professional-grade finished product.

An advantage of some embodiments of the invention is that the shape of the alignment markers can be unique to the transducer, since the markers are not a part of the signal carrying circuitry. Therefore, a manufacturer typically will not have to take into account the effects of the markers on the signal-carrying properties of the transducer assembly. In fact, a manufacturer can design the markers any desirable way, keeping in mind the shape of the transducer, as the shape of the markers is not dependent on another function. Thus, some embodiments of the present invention allow for the separation of functions of markers and elements that affect performance, thereby permitting engineers to optimize each separately.

It should be noted that some manufacturers use computer programs to space out the dicing cuts of the acoustic elements in relation to features that have little relation to the acoustic performance of the product, for example, by using the edges of the backing block to index cuts. Various embodiments of the present invention may provide for more accuracy, since the markers are laid out in an alignment related to that of the traces.

Additionally, some embodiments are not limited to simply making cuts aligned between leads. For example, in some embodiments it might be desirable to place the leads off center while still making cuts along the entire length of the acoustic stack. Accordingly, alignment markers may be placed where necessary to guide the dicing saw operator. Therefore, in a general sense, some embodiments allow placing markers in any desirable pattern or placement.

Further, a manufacturer may use optical or electrical sensing machinery to recognize the markers and to place the kerfs and/or dicing cuts. For instance, machines may be able to detect the placement of markers made of conducting material (as in FIG. 4) by deriving an electromagnetic signal from the markers. The markers may also be used to conduct signals if desired. For example, a machine may detect the markers when receiving the signal through contact. These features may permit the development of specialized machinery to recognize and follow alignment marks.

Various embodiments of the invention may improve the accuracy of dicing cuts above that provided by prior art dicing techniques. For example, basing dicing cuts on kerfs, such as those described with regard to FIG. 4, may result in fewer cut signal traces than the prior art technique of indexing from a side of the acoustic stack. Fewer cut traces leads to less waste and less cost to the manufacturer.

The examples above describe transducer arrays with a single row of elements. However, those of skill in the art will recognize that some embodiments may be adapted for use in systems that have multiple rows of elements. Further, the array may be straight or curved (concave or convex), depending on the application.

While the examples herein describe embodiments in the context of flex circuits in acoustic transducers, the invention is not so limited, as some embodiments may be adapted for use in systems that include optical, pressure, or other transducers. In fact, some embodiments may be adapted for use, more generally, in any kind of application that includes a plurality of small contacts on diced electrical components. For instance, a manufacturer may lay down a pattern of fine-conductor coaxial cables to make contact with a side of a transducer array. Then the manufacturer may make connections by, for example, soldering the cables to the transducer before it is diced. According to one embodiment of the invention, instead of relying upon the soldered connections, themselves, as guides for cutting, the manufacturer may add a secondary layer of alignment features that are not part of the signal-carrying circuit to indicate positions of the conductors. Examples of possible alignment features include lines on a sheet of insulating material and copper tabs that are laid down and insulated from a ground plane.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A cable comprising:
a plurality of conductors terminating at a leading edge of said cable; and
markers disposed at said leading edge providing visual reference points at one or more predetermined positions, said markers separate from said plurality of conductors, and wherein said markers comprise portions of conducting material separated from said plurality of conductors by a layer of insulating material upon which said plurality of conductors are placed.

2. The cable of claim 1 wherein said markers indicate positions of said plurality of conductors in said cable.

3. The cable of claim 1 wherein said layer of insulating material is a ribbon of flexible polymer.

4. The cable of claim 1 wherein said portions of conducting material are isolated from a ground plane, said ground plane placed upon said layer of insulating material on an opposite surface from plurality of conductors.

5. The cable of claim 1 wherein said cable is embedded in a block of acoustic backing material, said block including a surface wherein said leading edge of said cable is visible.

6. The cable of claim 5 wherein said surface of said block includes scoring placed according to said markers.

7. The cable of claim 5 wherein said surface of said block includes dicing cuts placed according to said markers.

8. The cable of claim 1 wherein said plurality of conductors includes a plurality of signal traces connected by a buss at the leading edge such that said signal traces are not visible at said leading edge.

9. A cable comprising:
a flex circuit including a layer of insulating material and a plurality of conductors terminating at a leading edge of said cable, wherein said plurality of conductors are placed on said layer of insulating material; and
a supporting block surrounding said flex circuit and exposing said leading edge at a surface of said supporting block, wherein said leading edge includes a structure that extends beyond said surface, said structure indicating positions of said plurality of conductors, said structure separate from said plurality of conductors.

10. The cable of claim 9 wherein said structure comprises portions of conducting material.

11. The cable of claim 9 wherein said layer of insulating material is a flexible polymer.

12. The cable of claim 9 further comprising a ground plane of conducting material on said layer of insulating material.

13. The cable of claim 9 wherein said plurality of conductors includes a plurality of signal traces connected by a buss at said leading edge.

14. The cable of claim 13 wherein said surface of said supporting block is cut parallel to said signal traces according to said structure.

15. A cable comprising:
a flex circuit including a layer of insulating material and a plurality of conductors terminating at a leading edge of said cable, wherein said plurality of conductors are placed on said layer of insulating material; and
a supporting block surrounding said flex circuit and exposing said leading edge at a surface of said supporting block, wherein said leading edge includes a structure that extends beyond said surface, wherein said structure comprises a portion of said layer of insulating material, said structure indicating positions of said plurality of conductors, said structure separate from said plurality of conductors.

16. A method for manufacturing a transducer device, said method comprising:
   providing a cable, said cable including:
      a flex circuit including a plurality of conductors terminating at a leading edge of said cable and a layer of an insulating material on said plurality of conductors; and
      a supporting block surrounding said flex circuit and exposing said leading edge at a surface of said supporting block, wherein said leading edge includes a structure that extends beyond said surface, said structure including visual cues that indicate positions of a plurality of signal traces;
   positioning an electronic component on said surface of said supporting block so that said structure is folded and said visual cues extend beyond the edges of said electronic component; and
   based upon said visual cues, dicing said electronic component to produce a plurality of separate transducer elements, each element connected to at least one conductor of said plurality of conductors.

17. The method of claim 16 wherein said electronic component is an acoustic stack including one or more layers of a piezoelectric material.

18. The method of claim 16 wherein said structure comprises portions of conducting material.

19. The method of claim 16 wherein said layer of insulating material is a flexible polymer.

20. The method of claim 16 wherein said flex circuit further comprises a ground plane of conducting material on said layer of insulating material.

21. The cable of claim 16 wherein said plurality of conductors includes a plurality of signal traces connected by a buss at said leading edge.

22. A method for manufacturing a transducer device, said method comprising:
   providing a cable, said cable including:
      a flex circuit including a plurality of conductors terminating at a leading edge of said cable and a layer of an insulating material on said plurality of conductors; and
      a supporting block surrounding said flex circuit and exposing said leading edge at a surface of said supporting block, wherein said leading edge includes a structure that extends beyond said surface, said structure including visual cues that indicate positions of a plurality of signal traces;
   positioning an electronic component on said surface of said supporting block so that said structure is folded and said visual cues extend beyond the edges of said electronic component;
   based upon said visual cues, dicing said electronic component to produce a plurality of separate transducer elements, each element connected to at least one conductor of said plurality of conductors; and
   removing a portion of said structure that extends beyond said edges of said electronic component.

23. A method for manufacturing a transducer device, said method comprising:
   providing a cable, said cable including:
      a flex circuit including a plurality of conductors terminating at a leading edge of said cable and a layer of an insulating material on said plurality of conductors; and
      a supporting block surrounding said flex circuit and exposing said leading edge at a surface of said supporting block, wherein said leading edge includes a structure that extends beyond said surface, wherein said structure comprises a portion of said layer of insulating material, said structure including visual cues that indicate positions of a plurality of signal traces;
   positioning an electronic component on said surface of said supporting block so that said structure is folded and said visual cues extend beyond the edges of said electronic component; and
   based upon said visual cues, dicing said electronic component to produce a plurality of separate transducer elements, each element connected to at least one conductor of said plurality of conductors.

24. A method for manufacturing a transducer array, said method comprising:
   providing a cable, said cable including:
      a flex circuit including a layer of an insulating material, a plurality of conductors terminating at a leading edge of said cable, said plurality of conductors placed upon said layer of said insulating material, and a plurality of alignment markers placed upon said layer of insulating material at said leading edge, said plurality of alignment markers being electrically isolated from said plurality of conductors;
      a supporting block surrounding said flex circuit and exposing said leading edge of said flex circuit at a surface of said supporting block, wherein said plurality of alignment markers at said leading edge indicate positions of said plurality of conductors;
   scoring said surface based on said alignment markers to produce kerfs that indicate said positions of said plurality of conductors;
   positioning an electronic component on said surface so that said electronic component is in electrical communication with said plurality of conductors; and
   dicing said electronic component at one or more places, based upon said kerfs, to produce a plurality of separate transducer elements.

25. The method of claim 24 wherein said alignment markers are portions of conducting material separated from said conductors by said layer of insulating material.

26. The method of claim 25 wherein said portions of conducting material are isolated from a ground plane, said ground plane placed upon said layer of insulating material on an opposite surface from said buss and said signal traces.

27. The method of claim 24 wherein said layer of insulating material is a ribbon of flexible polymer.

28. The method of claim 24 wherein said supporting block includes acoustic backing material.

29. The method of claim 24 wherein said plurality of conductors includes a plurality of signal traces connected by a buss at said leading edge.

30. The method of claim 29 herein said dicing step includes cutting through said buss so that said signal traces are electrically isolated from each other.

31. A cable for carrying signals to and from a transducer array, said cable comprising:
   a plurality of signal traces connected by a buss at a leading edge of said cable, said signal traces embedded in a block of insulating material, said block of insulating material including a surface wherein said leading edge is exposed; and
   means, at said surface, to indicate positions of said plurality of signal traces in said cable, said indicating means separate from said traces and said buss.

32. The cable of claim 31 wherein said indicating means includes a structure that extends beyond said surface.

33. The cable of claim 31 wherein said indicating means includes markers in said leading edge.

* * * * *